(12) United States Patent
Kang et al.

(10) Patent No.: US 8,110,505 B2
(45) Date of Patent: Feb. 7, 2012

(54) LEAD FRAME MANUFACTURED FROM LOW-PRICED MATERIAL AND NOT REQUIRING STRICT PROCESS CONTROL, SEMICONDUCTOR PACKAGE INCLUDING THE SAME, AND METHOD OF MANUFACTURING THE LEAD FRAME AND THE SEMICONDUCTOR PACKAGE

(75) Inventors: Sung-il Kang, Changwon (KR); Chang-han Shim, Changwon (KR)

(73) Assignee: Samsung Techwin Co., Ltd., Changwon (KR)

( * ) Notice: Subject to any disclaimer, the term of this patent is extended or adjusted under 35 U.S.C. 154(b) by 175 days.

(21) Appl. No.: 12/466,655

(22) Filed: May 15, 2009

(65) Prior Publication Data
US 2009/0283884 A1 Nov. 19, 2009

(30) Foreign Application Priority Data
May 16, 2008 (KR) .................. 10-2008-0045512

(51) Int. Cl.
*H01L 21/311* (2006.01)
(52) U.S. Cl. ........ 438/702; 438/700; 438/734; 438/736; 438/444

(58) Field of Classification Search ............. 438/106, 438/108, 426, 113, 401, 114, 592, 443, 444, 438/445, 669, 672, 673, 689, 695, 700, 702, 438/734, 735, 736; 257/684, 698, 713, 692, 257/796, 676, 666
See application file for complete search history.

(56) References Cited

U.S. PATENT DOCUMENTS
2001/0008305 A1 7/2001 McLellan et al.
2009/0034225 A1* 2/2009 Shoji et al. .................. 361/809

FOREIGN PATENT DOCUMENTS
KR 1998-087404 A 12/1998
* cited by examiner

*Primary Examiner* — Ha Tran T Nguyen
*Assistant Examiner* — Thanh Y Tran
(74) *Attorney, Agent, or Firm* — Sughrue Mion, PLLC

(57) ABSTRACT

Provided are a lead frame, a semiconductor package, and a method of manufacturing the lead frame and the semiconductor package. The lead frame includes: a die pad on which a semiconductor chip is installable; a plurality of lead patterns formed around a circumference of the die pad; an insulating organic material filling etching spaces interposed between the die pad and the lead patterns and structurally supporting the die pad and the lead patterns; and a pre-plating layer formed on both upper and lower surfaces of the die pad and the lead patterns.

9 Claims, 8 Drawing Sheets

FIRST HALF ETCHING

SECOND HALF ETCHING

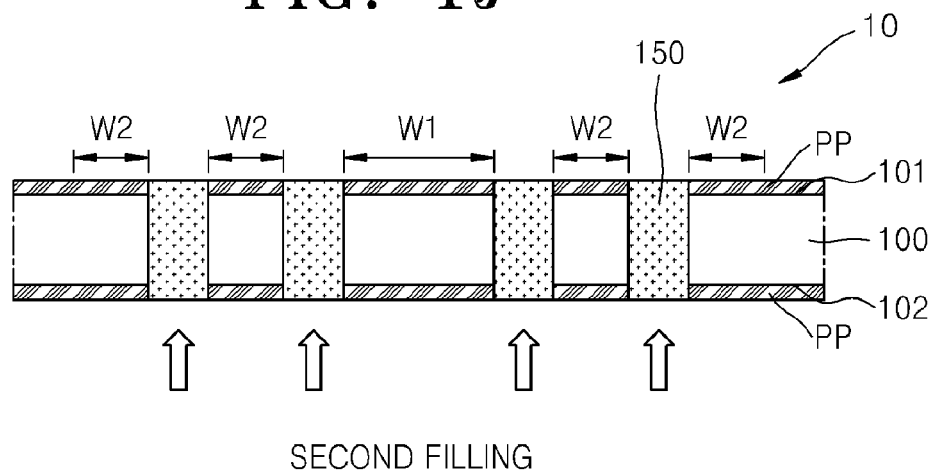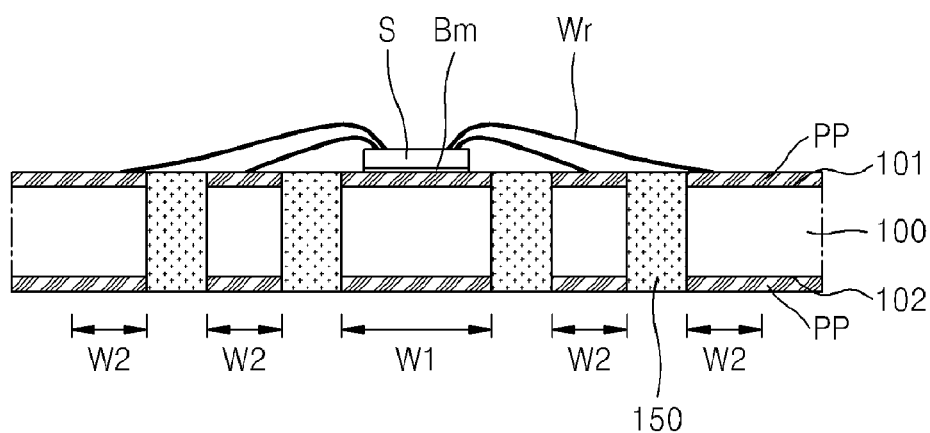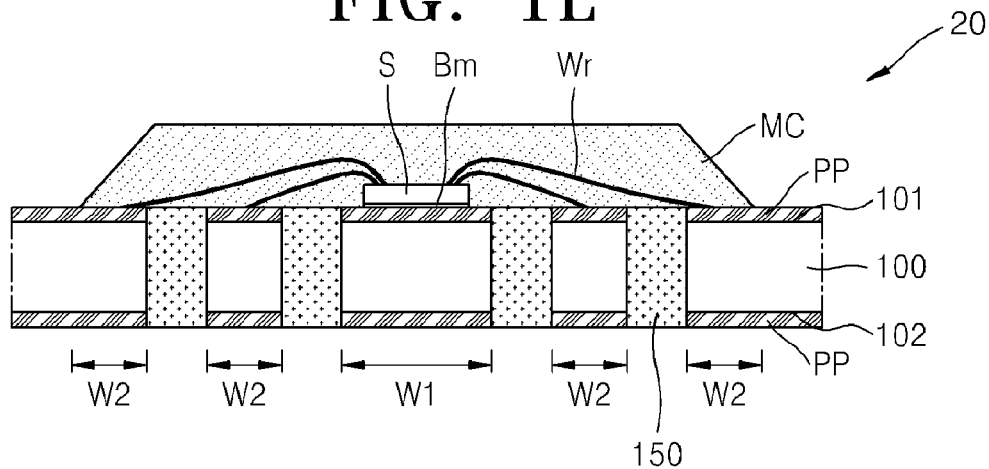

LEAD FRAME MANUFACTURED FROM LOW-PRICED MATERIAL AND NOT REQUIRING STRICT PROCESS CONTROL, SEMICONDUCTOR PACKAGE INCLUDING THE SAME, AND METHOD OF MANUFACTURING THE LEAD FRAME AND THE SEMICONDUCTOR PACKAGE

CROSS-REFERENCE TO RELATED PATENT APPLICATION

This application claims priority from Korean Patent Application No. 10-2008-0045512, filed on May 16, 2008, in the Korean Intellectual Property Office, the disclosure of which is incorporated herein in its entirety by reference.

BACKGROUND OF THE INVENTION

1. Field of the Invention

Apparatuses and methods consistent with the present invention relate to a lead frame, a semiconductor package including the lead frame, and manufacturing the lead frame and the semiconductor package, and more particularly, to a lead frame having a fine pitch and fine pattern which can be mass-produced with low manufacturing costs, a semiconductor package including the lead frame, and manufacturing the lead frame and the semiconductor package.

2. Description of the Related Art

Due to the ongoing miniaturization of communication devices and electric devices, the miniaturization and multi-function-integration of semiconductor packages have been accomplished. Since miniaturization and high-integration of semiconductor packages are simultaneously required, various technologies capable of reducing the area of a package and increasing the number of input and output terminals, such as the use of a Ball Grid Array (BGA), have been introduced. In particular, various technologies relating to methods of manufacturing a multi-row package having an array form, such as a matrix pattern form, in which a number of input and output terminals are integrated around a semiconductor chip, have been introduced. Also, various studies for fine-pitching or fine patterning a lead pattern as an internal circuit connecting each input and output terminal corresponding to electrode terminals of the semiconductor chip and for securing sufficient lead space and mechanical stability are currently being developed. However, in related art technologies, high-priced materials and various manufacturing operations are essential, strict process control is required, and tack-time is increased so that the price of products is adversely raised. In addition to this, error occurrence during manufacturing operations directly affects electric properties of the final product such that normal circuit operation is sometimes impossible. This results in difficulties in strict error management and an increase in the amounts of defective products.

SUMMARY OF THE INVENTION

The present invention provides a lead frame which may be formed by employing a low priced and generally used material as a raw material, not requiring strict process control, and reducing a manufacturing cost through reduction of the tack-time, and a semiconductor package which includes the lead frame, and a method of manufacturing the lead frame and the semiconductor package.

The present invention also provides a lead frame in which electric short circuiting, which causes incomplete separation of patterns formed on the lead frame, may be remarkably reduced, a semiconductor package, the semiconductor package including the lead frame, and a method of manufacturing the lead frame and the semiconductor package.

According to an aspect of the present invention, there is provided a lead frame including: a die pad on which a semiconductor chip is installable; a plurality of lead patterns formed around a circumference of the die pad; an insulating organic material filling etching spaces interposed between the die pad and the lead patterns and structurally supporting the die pad and the lead patterns; and a pre-plating layer formed on both upper and lower surfaces of the die pad and the lead patterns.

The die pad and the lead patterns may be formed of a single layer in a uniform composition of copper (Cu), nickel (Ni), or an alloy thereof.

The insulating organic material may include at least one selected from the groups consisting of monomer for polyimide (PI) film, a photo solder resist (PSR) for ball grid array (BGA), and an epoxy molding compound (EMC).

The pre-plating layer may be formed, for example, of a single layer formed of copper (Cu) or a Cu alloy, Ni or a Ni alloy, Pd or a Pd alloy, or gold (Au) or an Au alloy, or a multiple layer formed of a mixture thereof.

The lead pattern may have a multi-row structure forming an array having a plurality of at least two rows arranged along the circumference of the die pad.

The die pad and the lead patterns may have a Quad Flat Non-leaded (QFN) structure in which the die pad and the lead patterns are disposed on a substantially same plane.

According to another aspect of the present invention, there is provided a semiconductor package including: a die pad supporting a semiconductor chip; a plurality of lead patterns formed around the circumference of the die pad; an insulating organic material filling etching spaces interposed between the die pad and the lead patterns and structurally supporting the die pad and the lead patterns; a pre-plating layer formed on both upper and lower surfaces of the die pad and the lead patterns; an interconnection member electrically connecting an electrode terminal of the semiconductor chip and the lead patterns; and a molding resin sealing and integrating at least the semiconductor chip and the interconnection member.

The die pad and the lead patterns may be formed of a single layer in a uniform composition of copper (Cu), nickel (Ni), or an alloy thereof.

The insulating organic material may include at least one selected from the groups consisting of a monomer for a polyimide (PI) film, a photo solder resist (PSR) for a ball grid array (BGA), and an epoxy molding compound (EMC).

The pre-plating layer may be formed, for example, of a single layer formed of copper (Cu) or a Cu alloy, Ni or a Ni alloy, Pd or a Pd alloy, or gold (Au) or an Au alloy, or a multiple layer formed of a mixture thereof.

According to another aspect of the present invention, there is provided a method of manufacturing a lead frame, the method including: preparing a substrate used to form the lead frame; forming a first mask pattern and a second mask pattern covering a die pad and lead patterns on both first and second surfaces of the substrate; using the first mask pattern as an etching prevention layer to half-etch the first surface of the substrate to a first etching depth and using the second mask pattern as an etching prevention layer to half-etch the second surface of the substrate to a second etching depth, wherein the half-etching controls the first and second etching depths to allow thin portions in the thickness direction of the substrate to remain; removing the first and second mask patterns and pre-plating for forming a pre-plating layer on the first and second surfaces of the substrate; first filling the first etching depth exposed by the first surface of the substrate with an insulating organic material; using the pre-plating layer as an etching prevention layer to back-etch the second surface of the substrate so as to completely remove the thin portions; and second filling of the insulating organic material from the second surface of the substrate.

The raw material of the lead frame may be formed, for example, of a single layer in a uniform composition of copper (Cu), nickel (Ni), or an alloy thereof.

In the pre-plating, a single layer formed of copper (Cu) or a Cu alloy, Ni or a Ni alloy, Pd or a Pd alloy, or gold (Au) or an Au alloy, or a multiple layer formed of a mixture thereof may be formed.

The pre-plating may include: performing first plating to form a first plating layer comprising nickel (Ni) or a Ni alloy; performing second plating to form a second plating layer on the first plating layer, the second plating layer comprising palladium (Pd) or a Pd alloy; and performing third plating to form a third plating layer on the second plating layer, the third plating layer comprising at least one metal selected from the group consisting of silver (Ag), gold (Au), titanium (Ti), and palladium (Pd).

In the first and second filling processes of the insulating organic material, the insulating organic material may include at least one selected from the groups consisting of a monomer for a polyimide (PI) film, a photo solder resist (PSR) for a ball grid array (BGA), and an epoxy molding compound (EMC).

According to another aspect of the present invention, there is provided a method of manufacturing a semiconductor chip, the method including: preparing a substrate for a lead frame; forming a first mask pattern and a second mask pattern covering a die pad and lead patterns on both first and second surfaces of the substrate; using the first mask pattern as an etching prevention layer to half-etch the first surface of the substrate to a first etching depth and using the second mask pattern as an etching prevention layer to half-etch the second surface of the substrate to a second etching depth, wherein the half-etching controls the first and second etching depths to allow thin portions in the thickness direction of the substrate to remain; removing the first and second mask patterns and pre-plating for forming a pre-plating layer on the first and second surfaces of the substrate; first filling the first etching depth exposed to the first surface of the substrate with an insulating organic material; using the pre-plating layer as an etching prevention layer to back-etch the second surface of the lead frame so as to completely remove the thin portions; second filling of the insulating organic material from the second surface of the lead frame; installing a semiconductor chip on the die pad; electrically interconnecting an electrode terminal of the semiconductor chip and the lead patterns using an interconnection member interposed between the electrode terminal and the lead patterns; and performing resin molding to seal and integrate an interconnected portion of the semiconductor chip.

The raw material of the lead frame may be formed, for example, of a single layer in a uniform composition of copper (Cu), nickel (Ni), or an alloy thereof.

In the pre-plating, a single layer formed of copper (Cu) or a Cu alloy, Ni or a Ni alloy, Pd or a Pd alloy, or gold (Au) or an Au alloy, or a multiple layer formed of a mixture thereof may be formed.

In the first and second filling processes of the insulating organic material, the insulating organic material may include at least one selected from the groups consisting of a monomer for a polyimide (PI) film, a photo solder resist (PSR) for a ball grid array (BGA), and an epoxy molding compound (EMC) for.

In the interconnecting, the electrode terminal of the semiconductor chip and the lead patterns may be wire bonded.

BRIEF DESCRIPTION OF THE DRAWINGS

The above and other features and advantages of the present invention will become more apparent by describing in detail exemplary embodiments thereof with reference to the attached drawings, in which:

FIGS. 1A through 1L are vertical cross-sectional diagrams illustrating each process of a method of manufacturing a lead frame and a semiconductor package, according to an exemplary embodiment of the present invention.

DETAILED DESCRIPTION OF EXEMPLARY EMBODIMENTS

Hereinafter, the present invention will be described more fully with reference to the accompanying drawings, in which exemplary embodiments of the invention are shown.

Figure 1A:
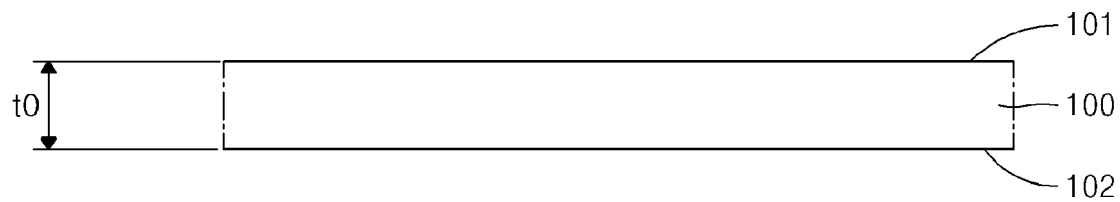
Figure 1B:
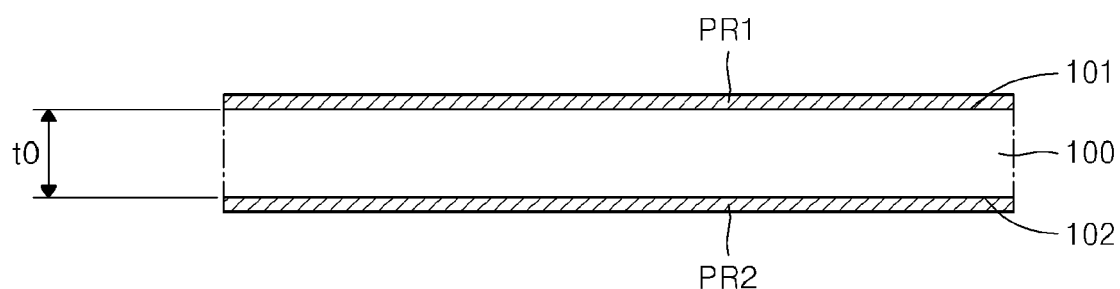

FIGS. 1A through 1L are vertical cross-sectional diagrams illustrating each process of a method of manufacturing a lead frame 10 (FIG. 1J) and a semiconductor package 20 (FIG. 1L), according to an exemplary embodiment of the present invention. Firstly, a thin film formed of copper (Cu) or a Cu alloy, a thin film formed of nickel (Ni) or a Ni alloy, or other thin film that is suitable as a material for a lead frame, is prepared as a substrate 100 for the lead frame 10 having an appropriate thickness t0. Then, as illustrated in FIG. 1B, first and second surfaces 101 and 102 of the substrate 100 are coated with a first photoresist film PR1 and a second photoresist film PR2. The first and second photoresist films PR1 and PR2 may be, for example, formed of a photosensitive resin, more particularly, a dried film resist (DFR), that is hardened through a chemical reaction when the photoresist films are exposed to UV radiation light.

Figure 1C:
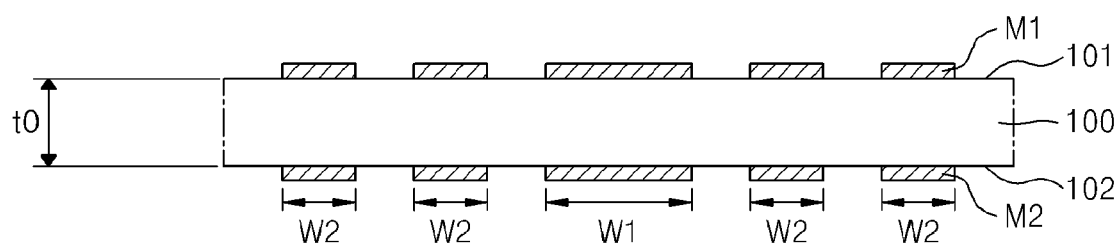

Then, as illustrated in FIG. 1C, an exposure mask (not illustrated) is used to apply a selective exposing process and, subsequently, a developing process to the first photoresist film PR1 disposed on the first surface 101 of the substrate 100 so as to form a first mask pattern M1 having a given pattern. Similarly, an exposure mask (not illustrated) is used to form a second mask pattern M2 disposed on the second surface 102 of the substrate 100. The first mask pattern M1 and the second mask pattern M2 cover a region for a die pad W1, where a semiconductor will be disposed, and regions for lead patterns W2 (see FIG. 1F). The first and second mask patterns M1 and M2 may be arranged on the upper side and the lower side of the substrate 100, respectively, so that the first and second mask patterns M1 and M2 are aligned with respect to each other in the thickness direction of the substrate 100. In a half-etching process which will be described later, the first and second mask patterns M1 and M2 are used to etch both the first and the second surfaces 101 and 102 of the substrate 100 so as to form the die pad W1 and the lead patterns W2. Thus, if the first and second mask patterns M1 and M2 are arranged inaccurately with each other and misaligning occurs, each of the die pad W1 and the lead patterns W2 may also be misaligned in the thickness direction of the substrate 100 from the first surface 101 to the second surface 102.

Figure 1D:
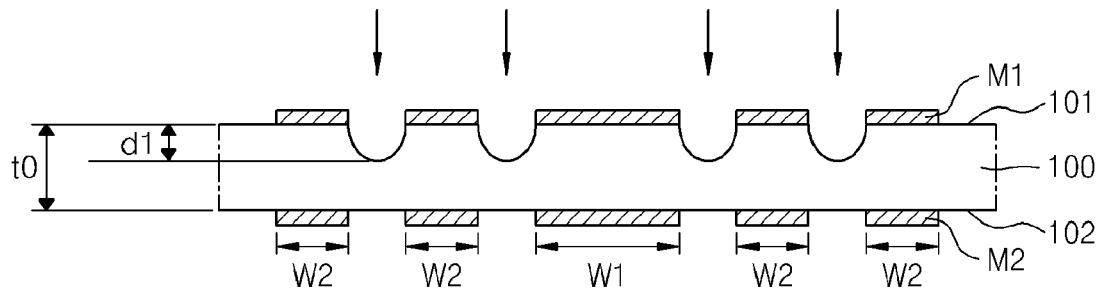
Figure 1E:
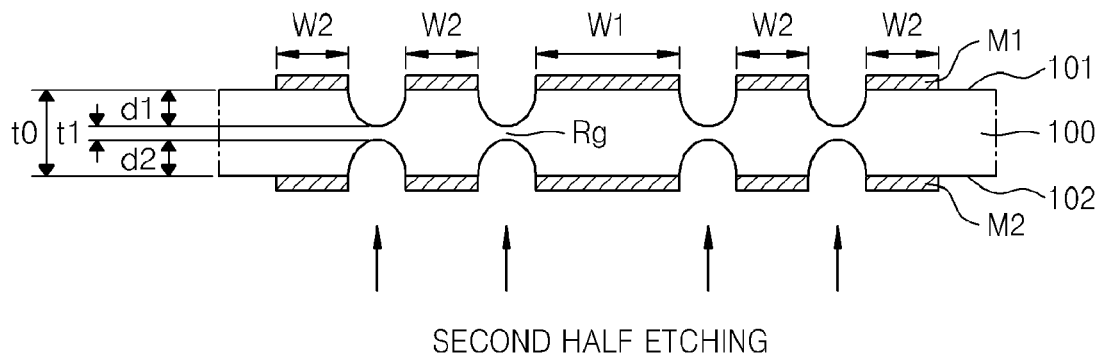

As illustrated in FIG. 1D, first half-etching is performed on the first surface 101 of the substrate 100 using the first mask pattern M1 as an etching prevention film. In the first half-etching, areas between the die pad W1 and the lead patterns W2 are removed to a first etching depth d1. Then, as illustrated in FIG. 1E, second half-etching is performed on the second surface 102 of the substrate 100 using the second mask pattern M2 as an etching prevention film. In the second half-etching, areas between the die pad W1 and the lead patterns W2 are removed to a second etching depth d2. Here, the first and second half-etchings are performed respectively as separate etching processes. However, the first and second half-etchings may be simultaneously performed as a single process and in this case, the number of processes and the tack-time may be reduced.

Figure 1F:
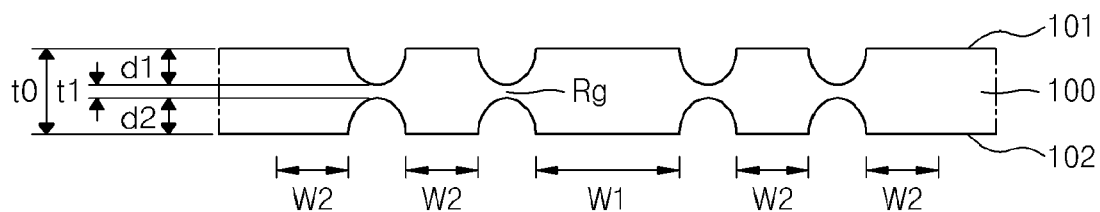
Figure 1G:
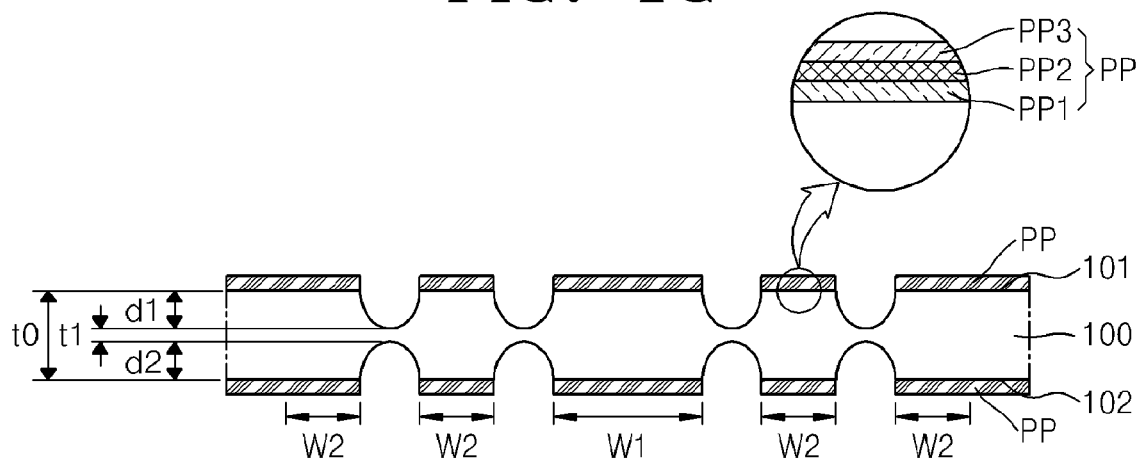

The first and second etching depths d1 and d2 may be determined such that some portions remaining after the areas between the die pad W1 and the lead patterns W2 are not completely removed form thin recessed portions Rg having a thickness t1. That is, the thin portions Rg may control conditions of the first and second half-etchings in order to provide structural supports for the die pad W1 and the lead patterns W2. For example, a processing time is appropriately controlled with reference to a corrosive characteristic of an etchant applied to half-etching so that a desired etching depth may be obtained. However, unlike a general etching process, the etching process for both surfaces as described above does not require strict process control for accurate control of the etching depth. That is, if the thin portions Rg can exist in the first and second half-etchings regardless of the specific numerical values of the first and second etching depths d1 and d2, the same quality can be secured in final products. When the first and second mask patterns M1 and M2 is not necessary in the following processes, the mask patterns M1 and M2 are exfoliated, thus leaving the patterned substrate 100 as illustrated in FIG. 1F.

Then, a pre-plating process for the first and second surfaces 101 and 102 of the substrate 100 is performed. Firstly, as illustrated in an enlarged view of FIG. 1G, a Ni plated layer PP1 is formed on the first and second surfaces 101 and 102. The Ni plated layer PP1 is mainly formed of nickel or a nickel alloy and prevents a metal component of the substrate 100 from diffusing to the surface thereof. Then, a Pd plated layer PP2 is formed on the Ni plated layer PP1. The Pd plated layer PP2 is mainly formed of palladium (Pd) or a Pd alloy and improves solder wettability. Moreover, a protection plating layer PP3 may be formed on the Pd plated layer PP2. The protection plating layer PP3 prevents the surface of the Pd plated layer PP2 from being oxidized, and more specifically, may be mainly formed, for example, of at least one metal selected from the group consisting of silver (Ag), gold (Au), titanium (Ti), and palladium (Pd). The protection plating layer PP3 is the outer most layer of the lead frame 10 (FIG. 1J), and improves bonding reliability based on an excellent affinity with a bonding wire mainly formed of gold (Au).

The pre-plating process described above may be performed by general electroplating and may form, for example, each of the plating layers PP1, PP2, and PP3 having a thin-film thickness of the order of a few μm. A pre-plating layer PP, which includes the Ni plated layer PP1, the Pd plated layer PP2 and the protection plating layer PP3 contributes to characteristics of wire bonding between an electrode terminal of a semiconductor chip and leads of lead patterns in a first level package. The pre-plating layer PP also contributes to characteristics of soldering between the leads and an external circuit (mainly, an external circuit board) in a second level package in which a contact point to the external circuit is formed. After patterning is performed by half-etching both surfaces to remove functionally unnecessary portions, the pre-plating process is applied so that only a functional portion such as a lead, which is a contact point with the external circuit board, is plated. Thus, compared with technologies in which etching is performed after forming a plating layer, a low-priced lead frame can be manufactured.

Meanwhile, the pre-plating layer PP may be formed of a single metal layer or a combination of a plurality of metal layers of different kinds, the metal layer having a functional metal component. The structure of the pre-plating layer PP is only an example and may have various forms. However, a suitable plated layer for pre-plating may be, for example, a nickel (Ni) plated layer formed of Ni or a Ni alloy, a palladium (Pd) plated layer formed of Pd or a Pd alloy, a gold (Au) plated layer formed of Au or an Au alloy, a silver (Ag) plated layer formed of Ag or an Ag alloy, or a copper (Cu) plated layer formed of Cu or a Cu alloy and the pre-plating layer PP may be formed of one of those layers detailed above or a combination of a plurality of those layers.

Figure 1H:
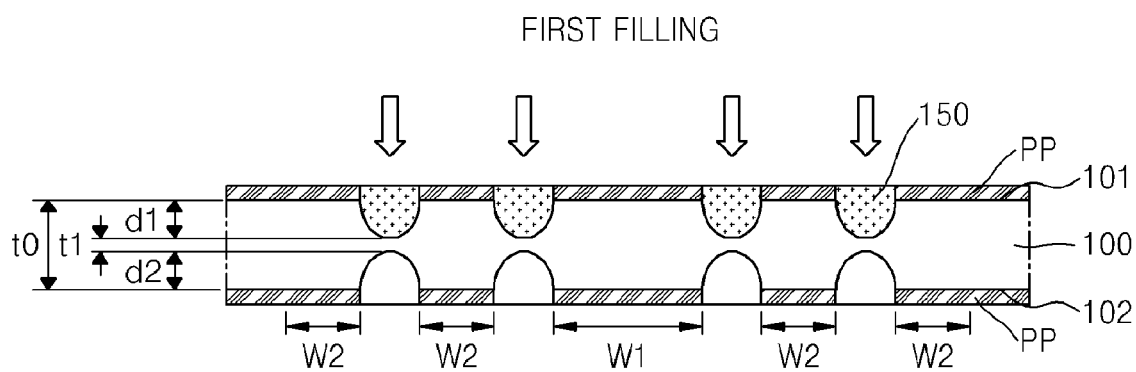

When the pre-plating process is completed, a first filling process is performed as illustrated in FIG. 1H, wherein in the first filling process, an insulating organic material 150 is filled in the etching spaces formed by the first half-etching (FIG. 1D) on the first surface 101. Examples of the insulating organic material 150 may include a monomer for a polyimide (PI) film, a photo solder resist (PSR) for a ball grid array (BGA), and an epoxy molding compound (EMC) for a lead frame. Also, any organic material with a hardening characteristic which provides excellent insulation and sufficient hardness for preventing an electric short may be considered as the insulating organic material 150. In filling the etching spaces using the insulating organic material 150, a general applying method such as screen printing may be used. The insulating organic material 150 fills the etching spaces so that the die pad W1 and the lead patterns W2 of the substrate 100 are formed as a single body without being structurally separated in a back-etching process, which will be performed later, and the insulating organic material 150 mechanically strengthens the whole frame structure for a semiconductor packaging process, which will be described later.

Figure 1I:
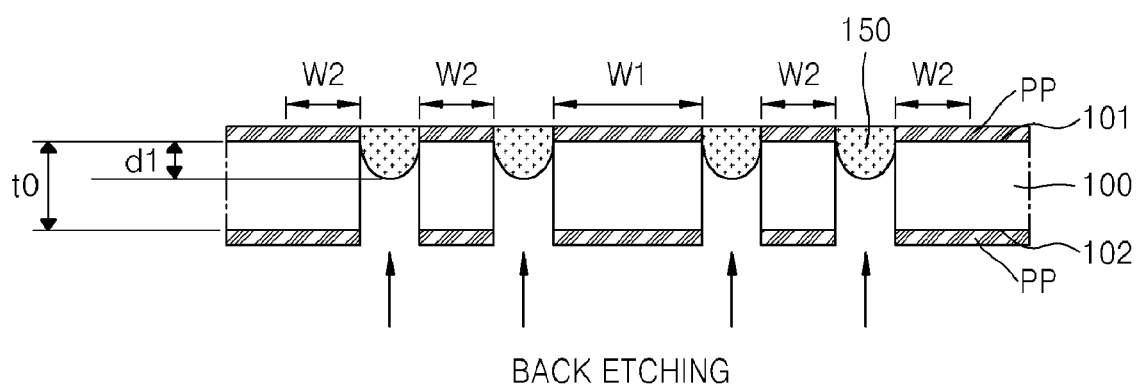

When the first filling process is completed, etching from the second surface 102 of the substrate 100, or so-called back-etching, is performed as illustrated in FIG. 1I. In the back-etching, the pre-plating layer PP, which is the outer most layer of the lead frame 10 (FIG. 1J), is used as an etching prevention layer. The back-etching is performed on the etching spaces formed by the second half-etching (FIG. 1E) on the second surface 102 of the substrate 100. Here, in the back-etching process, the thin portions Rg remaining in the half-etching process for the first and second surfaces 101 and 102 are removed. The back-etching is performed until the insulating organic material 150 filled in the etching spaces formed by the first half-etching (FIG. 1D) on the first surface 101 is exposed. An etchant applied in the back-etching may be a material having selective corrosive characteristics with respect to a base metal with copper (Cu) or nickel (Ni) components. The etchant may be a material having remarkably different corrosive characteristics (e.g., corrosive speed) with respect to the base metal in comparison with a metal component of the pre-plating layer. In the substrate 100 that is back-etched as above, the die pad W1 and the lead patterns W2 are electrically isolated from each other, and thus, electric short circuiting can be prevented.

When the back-etching process is completed, a second filling process is performed, wherein in the second filling process, the insulating organic material 150 is filled in the etching spaces formed by the second half-etching (FIG. 1E) on the second surface 102 of the substrate 100 and the back-etching (FIG. 1I), as illustrated in FIG. 1J. Similar to the first filling process, examples of the insulating organic material 150 may include a monomer for PI film, a PSR for a BGA, and an EMC for a lead frame in the second filling process. When both the first and second filling processes are completed, the areas between the die pad W1 and the lead patterns W2 of the substrate 100 are filled with the insulating organic material 150, and the insulating organic material 150 functions as lead-lock so as to strengthen the overall structure of the lead frame 10 (FIG. 1 J) to be manufactured and to provide mechanical hardness in order to increase convenience and stability of semiconductor packaging process, which will be described later. When the filling of the insulating organic material 150 is completed, the semiconductor packaging process is performed. In the semiconductor packaging process, a semiconductor chip is installed on the lead frame 10, input and output (I/O) terminals are electrically connected to the semiconductor chip, and the semiconductor chip is encapsulated using a molding resin. More specifically, as illustrated in FIG. 1K, a die adhesive Bm having an appropriate adhesion characteristic is attached on the die pad W1, and a semiconductor chip S is installed on the die adhesive Bm so that a position may be firmly fixed. Then, wire-bonding may be performed, wherein in the wire-bonding, an electrode terminal of the semiconductor chip S is electrically connected to the tips of the lead patterns W2. More specifically, in the wire-bonding, one end of a metal wire Wr that is mainly formed of gold (Au) is bonded to the electrode terminal exposed on the upper surface of the semiconductor chip S, and the other end of the metal wire Wr that extends from the electrode terminal is bonded to the tip of one of the lead patterns W2 so that the semiconductor chip S and the lead frame 10 are electrically interconnected. Here, a pre-plating layer PP formed at the tip of the one of the lead patterns W2 forms a heat bonding portion with the end portion of the metal wire Wr and form a contact point having high reliability.

Then, as illustrated in FIG. 1L, a resin molding process is performed to seal the lead frame 10 on which the semiconductor chip S is installed using a molding resin MC. In the resin molding process, the lead frame 10 on which the semiconductor chip S is installed is stored within a mold pattern for resin molding, an epoxy molding compound (EMC), for example, is inserted into the mold pattern, and a hardening process is performed at an appropriate temperature. Here, since the molding resin MC flows into the mold pattern covering the whole upper portion of the lead frame 10, except for the lower surface of the lead frame 10, a sealing body is formed as illustrated in FIG. 1L, and the semiconductor chip S and the lead frame 10 form an integrated semiconductor package 20. The land type lead patterns W2 exposed on the lower surface of the package form solder joints with a contact pad of the external circuit board, the solder joints including a solder bump interposed between the lead pattern W2 and the contact pad, and the pre-plating layer PP formed on the lower surface of the lead heat-bonds to the solder bump comprising tin through a reflow process, thereby forming solder joints having high reliability. Meanwhile, the structure of the semiconductor package as illustrated in FIGS. 1A through 1L has an array form having at least two rows of I/O contacts and is related to Multi-row Quad Flat Non-leaded (QFN) having a land type lead. However, the technical principles of the invention can be applied to other packages and manufacturing of the lead frame included in these other packages.

Figure 2A:
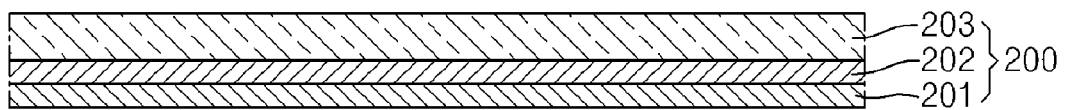
FIG. 2A through 2J are vertical cross-section diagrams illustrating each process of a method of manufacturing a lead frame and a semiconductor package, according to another exemplary embodiment of the present invention.
Figure 2B:
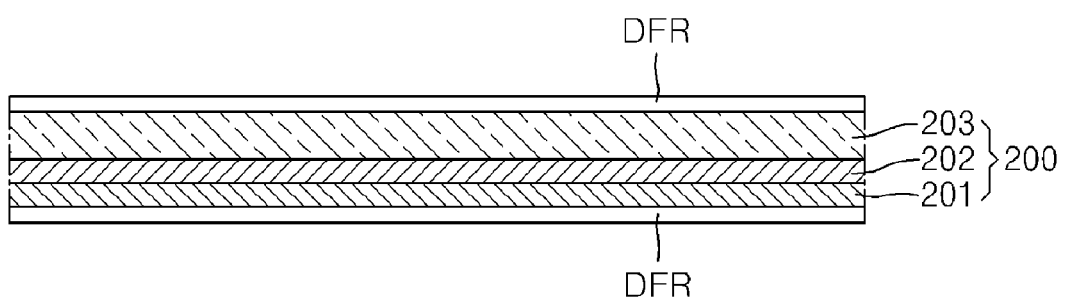
Figure 2C:
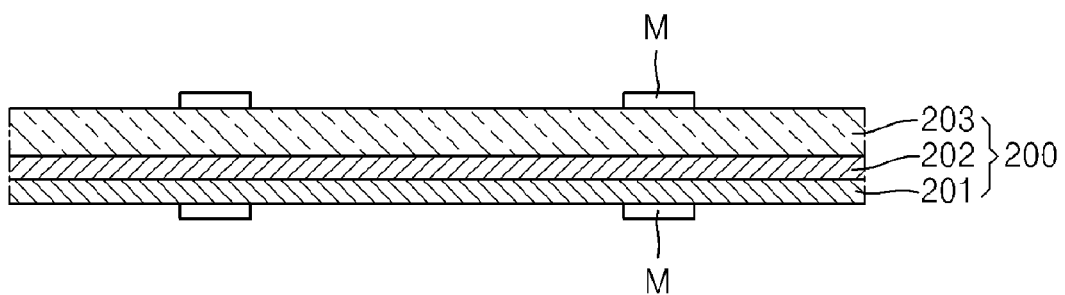
Figure 2D:
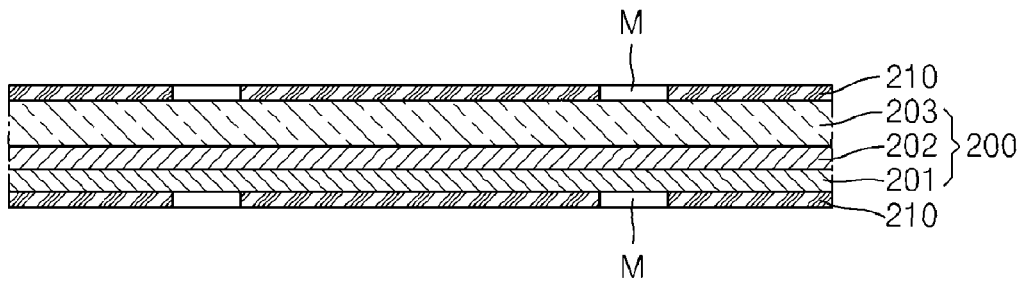
Figure 2E:
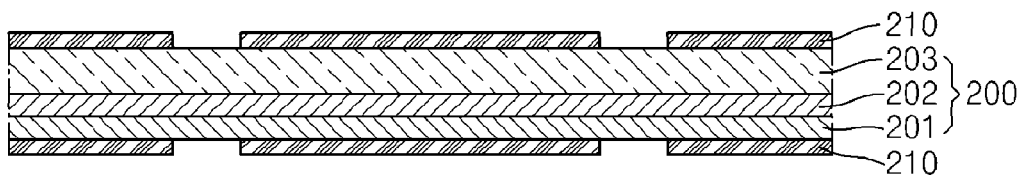
Figure 2F:
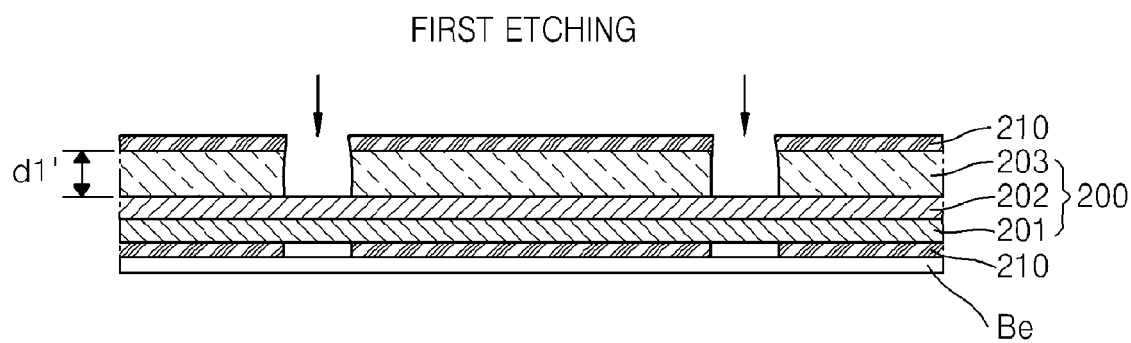
Figure 2G:
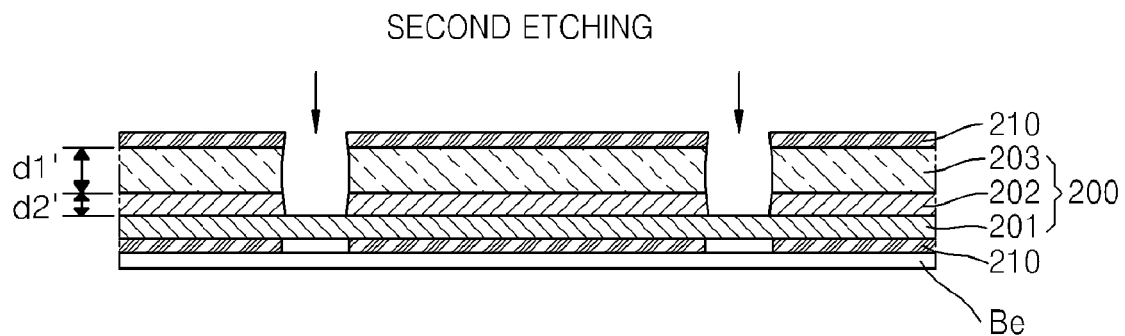
Figure 2H:
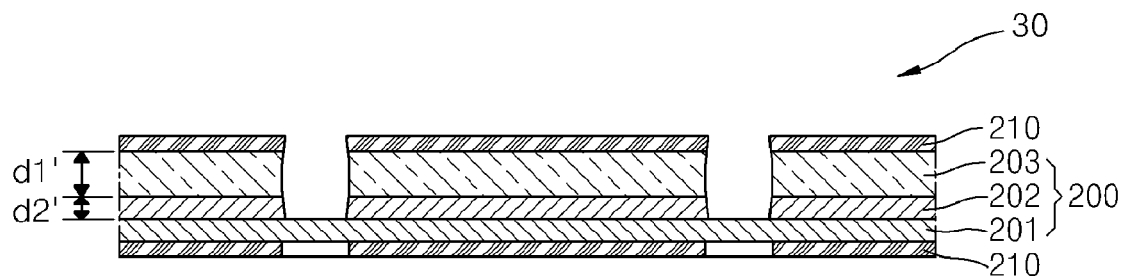
Figure 2I:
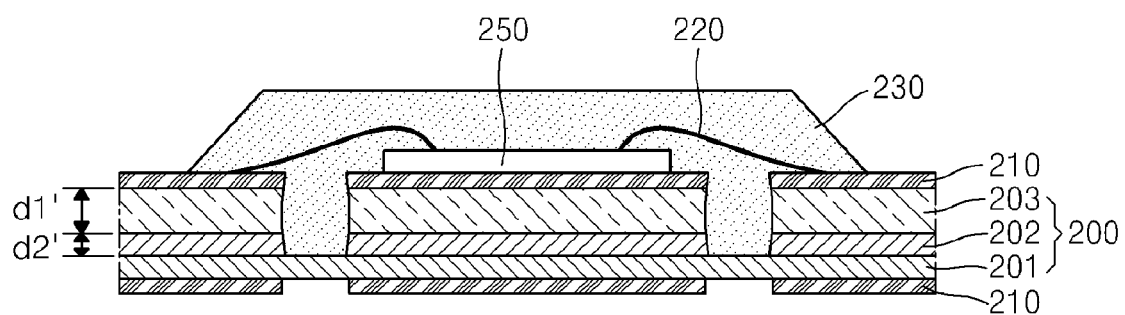
Figure 2J:
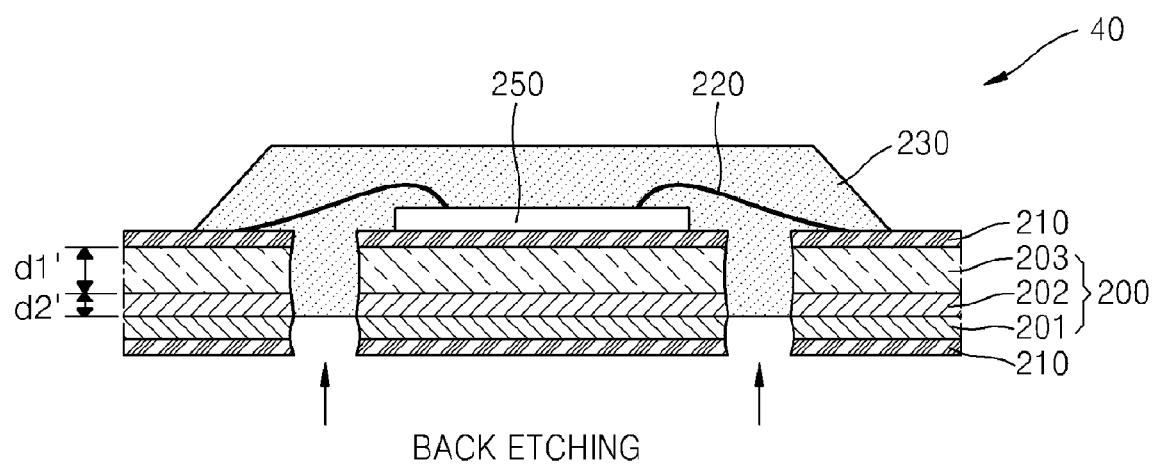

FIG. 2A through 2J are vertical cross-section diagrams illustrating each process of a method of manufacturing a lead frame 30 (FIG. 2H) and a semiconductor package 40 (FIG. 2I), according to another exemplary embodiment of the present invention. Firstly, as illustrated in FIG. 2A, a three-layered substrate 200 is prepared as a raw material, wherein a first copper (Cu) layer 201, a nickel (Ni) layer 202, and a second copper (Cu) layer 203 are sequentially stacked to form the substrate 200. Then, as illustrated in FIG. 2B, the DFR is coated on the entire surface of both upper and lower surfaces of the substrate 200. As illustrated in FIG. 2C, a DFR pattern M which selectively covers a predetermined portion of the first and second Cu layers 201 and 203 is formed through an exposure and development process and then, a plating layer 210 is formed as illustrated in FIG. 2D. Here, the plating layer 210 is plated on the first and second Cu layers 201 and 203, except for the DFR pattern M. Then, the DFR pattern M is removed so as to obtain the pattern of the plating layer 210 which covers some portions of the upper and lower surfaces of the substrate 200, as illustrated in FIG. 2E. Then, as in FIG. 2F, the lower surface of the substrate 200 is covered with an etching barrier (Be) so as to block the approach of an etchant, and an one-surface etching is performed from the upper surface of the substrate 200. The one-surface etching is classified into first and second etchings. In the first etching, the plating layer 210 is used as an etching prevention layer, the second Cu layer 203 is etched until the Ni layer 202 is exposed (etching depth is d1'). In the second etching illustrated in FIG. 2G, the plating layer 210 is used as an etching prevention layer, the Ni layer 202 is etched similar to the first etching until the first Cu layer 201 is exposed (etching depth is d2'). When both the first and second etchings are completed, the die pad, to which the semiconductor chip is to be installed, and the lead regions are patterned (not shown). Then, as illustrated in FIG. 2H, the etching barrier Be is removed. Then semiconductor packaging process is initiated. More specifically, as illustrated in FIG. 2I, a semiconductor chip 250 is installed on the die pad, the semiconductor chip 250 and the lead are connected using a wire bonding 220, and a molding resin 230 is used to seal the semiconductor chip 250. Finally, as illustrated in FIG. 2J, the molding resin 230 is used as an etching prevention layer and back-etching is performed from the lower surface of the lead frame 200 so that the die pad and the lead patterns are separated.

In the current exemplary embodiment of the present invention, since the three-layered lead frame on which Cu/Ni/Cu are sequentially stacked is used as a raw material, the unit cost of manufacturing the raw material may be increased, compared to the previous exemplary embodiment as shown in FIGS. 1A-1L, thereby increasing the cost of a final product. However, in the previous exemplary embodiment of the present invention, a low-priced lead frame material, for example, a lead frame material mainly formed of copper (Cu) or nickel (Ni), may be used and thus, the unit cost of manufacturing may be reduced. In the current exemplary embodiment of the present invention, two-step etching and so-called deep etching through the one surface of the lead frame are performed and thus, the number of processes and the tack-time may be increased, thereby increasing the unit cost of manufacturing the final product. However, in the previous exemplary embodiment of the present invention, so-called shallow etching which reduces an etching depth through etching for both surfaces is performed and thus, the manufacturing processes may be simplified and made more convenient, thereby reducing the unit cost of manufacturing a final product. In the current exemplary embodiment, more accurate control of the etching depth may be required during the first and second etching as illustrated in FIGS. 2F and 2G For example, if the Ni layer 202 is not completely removed and partially remains when the second etching is completed, the die pad and the lead patterns or adjacent lead patterns may not be completely separated from each other, causing electric short circuiting. As illustrated in FIG. 2J, in the final etching performed after the packaging process, since the molding resin 230 is used as a corrosion prevention layer, a short between the die pad and the lead patterns or between the adjacent leads may be caused due to insufficient etching of the first Cu layer 201 as a process error in packaging. In the previous exemplary embodiment of the present invention, packaging is performed after accomplishing complete formation of the lead frame, that is, complete insulation between the lead frame patterns, thus the possibility of manufacturing a final product of inferior quality due to the generation of short circuits may be minimized.

According to the previous exemplary embodiment of the present invention, a generally used lead frame material is used as a raw material, strict process control may not be required during the etching process, and both the upper and the lower surfaces may be etched so as to reduce an etching depth, thereby reducing overall manufacturing costs. Moreover, semiconductor packaging is performed after all patterns of the lead frames are completely formed and thus, short circuiting of the lead frame which causes a process error that may be found in other packaging methods may be removed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a lead frame, the method comprising:
    preparing a substrate comprising first and second surfaces;
    forming a first mask pattern on the first surface and a second mask pattern on the second surface to cover a region for a die pad and regions for at least one lead pattern;
    half-etching the first surface of the substrate to a first etching depth to form first etching space by using the first mask pattern as a first etching prevention layer, and half-etching the second surface of the substrate to a second etching depth to form second etching space by using the second mask pattern as a second etching prevention layer and, wherein the half-etching controls the first and second etching depths to allow thin portions in the thickness direction of the substrate to remain;
    removing the first and second mask patterns, and pre-plating the first and second surfaces of the substrate to form first and second pre-plating layers thereon, respectively;
    first filling the first etching space with an insulating material;
    back-etching the second etching space to extend the second etching space by using the second pre-plating layer as a third etching prevention layer, thereby completely removing the thin portions; and
    second filling the extended second etching space with the insulating material.

2. The method of claim 1, wherein the substrate is formed of at least one of copper (Cu), nickel (Ni), and an alloy thereof.

3. The method of claim 1, wherein at least one of the first and second pre- plating layers is a single layer formed of copper (Cu) or a Cu alloy, Ni or a Ni alloy, Pd or a Pd alloy, or gold (Au) or an Au alloy, or a multiple layer formed of a mixture thereof.

4. The method of claim 1, wherein the pre-plating comprises:
    performing first plating to form a first plating layer comprising nickel (Ni) or a Ni alloy;
    performing second plating to form a second plating layer on the first plating layer, the second plating layer comprising palladium (Pd) or a Pd alloy; and
    performing third plating to form a third plating layer on the second plating layer, the third plating layer comprising at least one metal selected from the group consisting of silver (Ag), gold (Au), titanium (Ti), and palladium (Pd).

5. The method of claim 1, wherein the insulating material comprises at least one selected from the group consisting of a monomer for a polyimide (PI) film, a photo solder resist (PSR) for a ball grid array (BGA), and an epoxy molding composite (EMC).

6. A method of manufacturing a semiconductor package, the method comprising:
    installing a semiconductor chip on the die pad of the lead frame manufactured by the method of claim 1;
    electrically interconnecting an electrode terminal of the semiconductor chip and the lead pattern using an interconnection member interposed between the electrode terminal and the lead pattern; and
    performing resin molding to seal and integrate an interconnected portion of the semiconductor chip.

7. The method of claim 6, wherein the substrate is formed of at least one of copper (Cu), nickel (Ni), and an alloy thereof.

8. The method of claim 6, wherein at least one of the first and second pre- plating layers is a single layer formed of copper (Cu) or a Cu alloy, Ni or a Ni alloy, Pd or a Pd alloy, or gold (Au) or an Au alloy, or a multiple layer formed of a mixture thereof.

9. The method of claim 6, wherein the insulating material comprises at least one selected from the group consisting of a monomer for a polyimide (PI) film, a photo solder resist (PSR) for a ball grid array (BGA), and an epoxy molding composite (EMC).

* * * * *